(12) United States Patent
Nishikawa et al.

(10) Patent No.: US 6,914,312 B2
(45) Date of Patent: Jul. 5, 2005

(54) FIELD EFFECT TRANSISTOR HAVING A MIS STRUCTURE AND METHOD OF FABRICATING THE SAME

(75) Inventors: Yukie Nishikawa, Kanagawa-Ken (JP); Noboru Fukushima, Tokyo (JP); Takeshi Yamaguchi, Kanagawa-Ken (JP); Hideki Satake, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/396,416

(22) Filed: Mar. 26, 2003

(65) Prior Publication Data

US 2003/0183885 A1 Oct. 2, 2003

(30) Foreign Application Priority Data

Mar. 29, 2002 (JP) .................................... 2002-094147

(51) Int. Cl.[7] .......................... H01L 29/76; H01L 29/94
(52) U.S. Cl. ....................................... 257/410; 257/411
(58) Field of Search .......................... 257/410, 411; 428/704

(56) References Cited

U.S. PATENT DOCUMENTS

2003/0072975 A1 * 4/2003 Shero et al. ................. 428/704

OTHER PUBLICATIONS

Y. H. Wu, et al., "Electrical Characteristics of High Quality $La_2O_3$ Gate Dielectric With Equivalent Oxide Thickness of 5 Å", IEEE Electron Device Letters, vol. 21, No. 7, Jul. 2000, pp. 341–343.

H. J. Osten, et al., "High–K Gate Dielectrics With Ultra–Low Leakage Current Based on Praseodymium Oxide", IEDM 2000 Technical Digest, pp. 653–656.

R. A. McKee, et al., "Crystalline Oxides on Silicon: The First Five Monolayers", Physical Review Letters, vol. 81, No. 14, Oct. 5, 1998, pp. 3014–3017.

R. A. McKee, et al., "Physical Structure and Inversion Charge at a Semiconductor Interface With a Crystalline Oxide", Science, vol. 293, Jul. 20, 2001, pp. 468–471.

Yukie Nishikawa, et al., "Direct Growth of Single Crystalline $CeO_2$ High–K Gate Dielectrics", Extended Abstracts of the 2001 International Conference on Solid State Devices and Materials, Tokyo, 2001, pp. 174–175.

M. Koyama, et al., "Thermally Stable Ultra–Thin Nitrogen Incorporated $ZrO_2$ Gate Dielectric Prepared by Low Temperature Oxidation of ZrN", IEDM 2001 Technical Digest, pp. 459–462.

* cited by examiner

Primary Examiner—Steven Loke
(74) Attorney, Agent, or Firm—Oblon, Spivak, McClelland, Maier & Neustadt, P.C.

(57) ABSTRACT

A MIS type field effect transistor including gate dielectrics having a rare-earth metal oxynitride layer with a high dielectric constant, which can maintain good interface characteristics, can be provided. A field effect transistor according to one aspect of this invention includes a gate dielectric having a substantially crystalline rare-earth metal oxynitride layer containing one or more metals selected from rare-earth metals, oxygen, and nitrogen. The rare-earth metal oxynitride layer contacts a predetermined region of a Si semiconductor substrate, and the nitrogen exists at the interface between the rare-earth metal oxynitride layer and the Si semiconductor substrate, and in the bulk of the rare-earth metal oxynitride. The transistor further includes a gate electrode formed on the gate dielectrics and source and drain regions, one being formed at one side of the gate electrode and the other being formed at the other side of the gate electrode in the Si semiconductor substrate.

20 Claims, 5 Drawing Sheets

FIELD EFFECT TRANSISTOR HAVING A MIS STRUCTURE AND METHOD OF FABRICATING THE SAME

CROSS-REFERENCE TO RELATED APPLICATIONS

This application is based upon and claims the benefit of priority from the prior Japanese Patent Application No. 2002-94147, filed on Mar. 29, 2002 in Japan, the entire contents of which are incorporated by reference herein.

BACKGROUND OF THE INVENTION

1. Field of the Invention

The present invention relates to semiconductor devices and method of fabricating the same, and in particular, to a field effect transistor (FET) having a MIS (Metal-Insulator-Semiconductor) structure.

2. Related Art

As the miniaturization of MOS (Metal-Oxide-Semiconductor) field effect transistors has advanced in accordance with the scaling law, the speed of LSIs has been accelerated, and the high integration of LSIs has been performed. According to the scaling law, the device performance has been improved by simultaneously decreasing the dimensions of both the height and the width of each part of MOSFETs, such as thickness of insulating layers, gate length, etc. For highly miniaturized LSIs produced in the 30-nanometer technology, which are expected to appear after the year 2010, the thickness of gate dielectric is required to be sufficiently thin, so that the equivalent $SiO_2$ thickness (also referred to as "EOT (Equivalent Oxide Thickness)" herein) for the gate dielectric is sufficiently less than 1 nm. However, in a conventional gate dielectric of $SiO_2$, as the thickness thereof becomes 2 nm or less, gate leakage current drastically increases due to direct carrier tunneling. Accordingly, it is impossible to keep the gate leakage current low, thereby causing problems, such as increase of power consumption, etc. In order to overcome these problems, it is necessary to use material with dielectric constant higher than that of $SiO_2$ for gate dielectric. This material is usually called to be "high-k gate dielectric". High-k gate dielectric can suppress gate leakage current with a low EOT being kept, since its physical thickness (actual thickness) is much thicker than that of $SiO_2$.

Recently, rare-earth metal oxides such as $La_2O_3$ (Y. H. Wu, M. Y. Yang, A. Chin, W. J. Chen and C. M. Kwei, IEEE Electron Device Lett. 21, 341 (2000)) and $Pr_2O_3$ (H. J. Osten, J. P. Liu, P. Ggaworzewski, E. Bugiel and P. Zaumseil, IEDM 2000 Technical Digest, San Francisco, p. 653 (2000)), which show small EOT and low leakage current density, have been attracting much attention as alternative high-k gate dielectric. Epitaxial single crystalline high-k dielectric directly grown on Si, which enables further reduction of EOT, would be the most promising candidate for the gate dielectric in highly-miniaturized LSIs.

However, it is well known that the elimination of an amorphous interfacial layer between a high-k dielectric and the Si substrate is difficult, and there is few reports regarding to the direct growth of the high-k dielectric on Si. The amorphous interfacial layer is a silicon oxide (SiOx) or a silicate with low dielectric constant. Thus, the capacitance between the Si substrate and the gate electrode is decreased, resulting in large EOT values. Mckee et. al reported direct growth of $SrTiO_3$ on Si and electrical characteristics as gate dielectric (R. A. Mckee, F. J. Walker and M. F. Chisholm, Phys. Rev. Lett. 81, 3014 (1998), R. A. Mckee, F. J. Walker and M. F. Chisholm, Science 293, 468 (2001)).

The present inventors have reported that they have succeeded in the direct growth of $CeO_2$, which is one of the rare earth metal oxides, on Si and realized an ultra-thin EOT value as small as 0.38 nm.

With respect to a gate dielectric of MISFETs, it is important to maintain good interfacial properties with Si, in addition to the suppression of gate leakage current. If many interface states exist between the Si substrate and the gate dielectric, they induce serious degradation of the transistor characteristics due to the decrease in the carrier mobility. However, the interfacial properties of rare-earth metal oxides have not been fully studied. In particular, there has been no report on the interfacial properties of single-crystalline metal oxide directly grown on the Si substrate. In order to realize highly-miniaturized LSIs with good device performances, it is essential to form a high quality interface between the high-k gate dielectric and the Si substrate with the EOT value of 1 nm or less.

High-kmaterials, such as $ZrO_2$, $HfO_2$, Zr silicate, Hf silicate, etc. (silicates are $SiO_2$ containing metals such as Zr or Hf), with which it is possible to achieve the EOT values of around 1 nm, are widely studied as a high-k gate dielectric for the highly-miniaturized LSIs for the next generation (after year 2005). These materials are basically amorphous, but it is known to be easily crystallized during high-temperature annealing processes such as impurity activation annealing for source and drain regions. Attempts have been made to suppress the crystallization and to improve thermal stability of these metal oxides and silicates by adding nitrogen thereto (For example, M. Koyama, K. Suguro, M. Yoshiki, Y. Kaminuta, M. Koike, M. Ohse, C. Hongoand A. Nishiyama, IEDM 2001 Technical Digest, Washington (2001)). However, it has been reported that the addition of nitrogen may degrade the interfacial properties of such amorphous materials. Another conventional way of increasing dielectric constants is the addition of nitrogen to $SiO_2$ to obtain SiON. However, in this case as well, the interface properties at the interface between SiON and Si substrate are inevitably degraded due to the addition of nitrogen.

As described above, the high-k gate dielectric with good interfacial properties is necessary to advance miniaturized LSIs with high integration and improved performances.

However, no high-k gate dielectric with low EOT has been achieved sufficiently good interface properties.

SUMMARY OF THE INVENTION

The present invention is proposed to solve the above-described problems, and it is an object of the present invention to provide a MIS type field effect transistor including a high-k gate dielectric with good interfacial properties and method of fabricating the same.

In order to achieve the above-described object, a field effect transistor according to one aspect of the present invention includes: a gate dielectric having a substantially crystalline rare-earth metal oxynitride layer containing one or more metals selected from rare-earth metals, oxygen, and nitrogen, the rare-earth metal oxynitride layer contacting a predetermined region of a Si semiconductor substrate, and the nitrogen existing at an interface between the rare-earth metal oxynitride and the Si semiconductor substrate and in a bulk of the rare-earth metal oxynitride layer; a gate electrode formed on the gate dielectric; and source and drain regions, one being formed at one side of the gate electrode and the other being formed at the other side of the gate electrode in the Si semiconductor substrate.

The gate dielectric may include an oxide layer with a high dielectric constant formed on the rare-earth metal oxynitride layer.

The rare-earth metal oxynitride layer may be epitaxially grown on the Si semiconductor substrate.

The rare-earth metal oxynitride layer may be single-crystalline.

The present inventors have clarified that, in crystalline materials, since the sites of oxygen atoms are clearly determined, the lack of oxygen atoms results in clear defects, and that therefore, it is necessary to compensate for such defects. For this reason, the effects of nitrogen are more noticeable in crystalline materials, and particularly remarkable in epitaxial materials or single-crystalline materials.

It is preferable that in the rare-earth metal oxynitride layer, the nitride content at the interface between the rare-earth metal oxynitride and the Si semiconductor substrate is higher than that in the bulk of the rare-earth metal oxynitride layer. In particular, the performance can be improved by setting the nitrogen surface density at the interface to be in the range of $(1\sim10)\times10^{13}$ cm$^{-2}$, and setting the nitrogen volume density in the bulk to be in the range of $1\times10^{17}$ cm$^{-3}\sim1\times10^{20}$ cm$^{-3}$.

Further, it is preferable that the rare-earth metal oxynitride layer contains Ce, Dy, or La as the rare earth metal.

A method of fabricating a field effect transistor according to another aspect of the present invention includes: terminating a surface of a Si semiconductor with a silicide layer containing one or more metals selected from rare-earth metals with thickness of 2 or less monolayers; supplying one or more metals selected from the rare-earth metals, an oxygen source, and a nitrogen source to form gate dielectrics including a substantially crystalline rare-earth metal oxynitride layer containing nitrogen at an interface between the rare-earth metal oxynitride layer and the Si semiconductor substrate and in a bulk of the rare-earth metal oxynitride layer; and forming a gate electrode on the gate dielectrics.

DESCRIPTION OF THE EMBODIMENTS

Hereinafter, embodiments of the present invention will be described with reference to the accompanying drawings.

Figure 1:
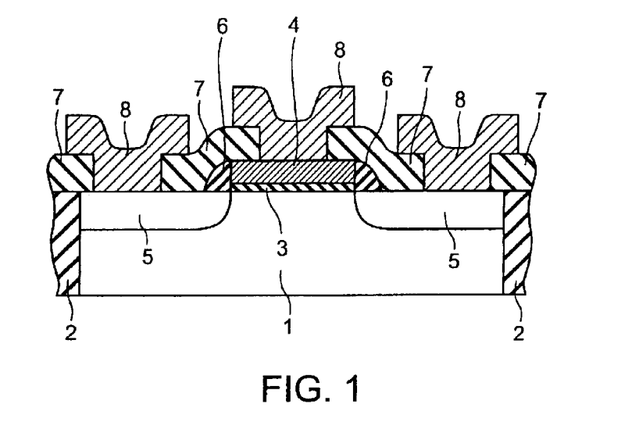
FIG. 1 is across-sectional view of the structure of a MISFET.

FIG. 1 is a cross-sectional view of the basic structure of an n-channel MISFET according to embodiments of the present invention. The n-channel MISFET is formed on a device formation region of a p-type Si substrate 1 isolated by device isolation regions 2. The MISFET includes gate dielectric 3 formed on the device formation region, a gate electrode 4 of polycrystalline silicon formed on the gate dielectric 3, a diffusion layer (source/drain regions) 5 formed at both sides of the gate electrode 4 in the device formation region, to which an n-type impurity is implanted, an dielectric 6 of, e.g., a CVD silicon nitride layer, formed at both sides of the gate electrode 4, and Al wirings 8 connected to the gate electrode 4 and the source/drain regions 5 via contact holes formed in an interlayer dielectric 7 formed of, e.g., a CVD silicon oxide layer.

The MISFET having the structure shown in FIG. 1 is fabricated in the following manner. First, grooves for device isolation are formed through reactive ion etching in the p-type Si substrate 1 having the (111) or (001) surface orientation with a resistivity of 4 Ωcm–6 Ωcm. Subsequently, the device isolation regions 2 are formed by filling, e.g., a LP-TEOS (Low-Pressure Tetra-Etoxy-Ortho-Silicate) layer in the grooves.

After the gate dielectric 3 is formed, a polycrystalline silicon layer is formed by chemical vapor deposition so as to cover the entire surface. The polycrystalline silicon layer is then patterned to form the gate electrode 4. Subsequently, the CVD silicon nitride layer 6 having a thickness of, e.g., 5 to 200 nm is deposited using a mixture gas of SiH$_4$ gas and NH$_3$ gas diluted with nitrogen gas under the conditions of, e.g., 450° C. in temperature and 0.1 Pa~1 atm (=1.013×10$^5$ Pa) in pressure. The subsequent processes are the same as those for a conventional MOSFET, i.e., ion implantation of arsenic with an acceleration voltage of 20 keV with a dose amount of 1×10$^{15}$ cm$^{-2}$, thereby forming the source/drain regions 5.

Then, a CVD silicon oxide layer to serve as the interlayer dielectric 7 is formed over the entire surface through chemical vapor deposition, and contact holes are formed through the interlayer dielectric 7. Subsequently, an Al layer is formed over the entire surface using sputtering method, and patterning the Al layer by reactive ion etching forms the Al wirings 8. Thus, the MISFET as shown in FIG. 1 is completed.

Next, a MISFET having a gate dielectric formed by the conventional method will be described as a comparative example to be compared with the field effect transistor formed in accordance with embodiments of the present invention, which will be described later.

As previously mentioned, the present inventors have reported that they have succeeded in direct growth of CeO$_2$, which is a rare-earth oxide, on a Si substrate having the (111) surface orientation by using molecular beam epitaxy (MBE) and achieved a ultra-thin gate dielectric (Y. Nishikawa, N. Fukushima and N. Yasuda, Ext. Abst. Inter. Conf. On Solid State Devices and Materials, Tokyo, p.174 (2001)). As the comparative example, this CeO$_2$ layer is used as a gate dielectric to form a MISFET as shown in FIG. 1, in order to carry out an evaluation of characteristics.

First, the method of forming the gate dielectric will be described in detail. A Si substrate having the (111) surface orientation is used. After the device isolation regions 2 are formed, the Si surface is hydrogen-terminated with diluted hydrofluoric acid. Subsequently, the substrate is inserted into an MBE machine. A CeO$_2$ layer is formed, using metal Ce as the deposition source, by depositing 0.6 monolayer of metal Ce on the Si substrate at the substrate temperature of 600° C. prior to ozone ($O_3$) supply. With such a fabricating procedure, it is possible to grow single-crystalline $CeO_2$ with the (111) surface orientation, which serves as the gate dielectric 3, without forming an amorphous layer such as a silicon oxide layer at the interface between $CeO_2$ and the Si substrate. Here, the EOT of the $CeO_2$ single-crystalline gate dielectric with a physical thickness of 5 nm is 0.4 nm.

Figure 2:
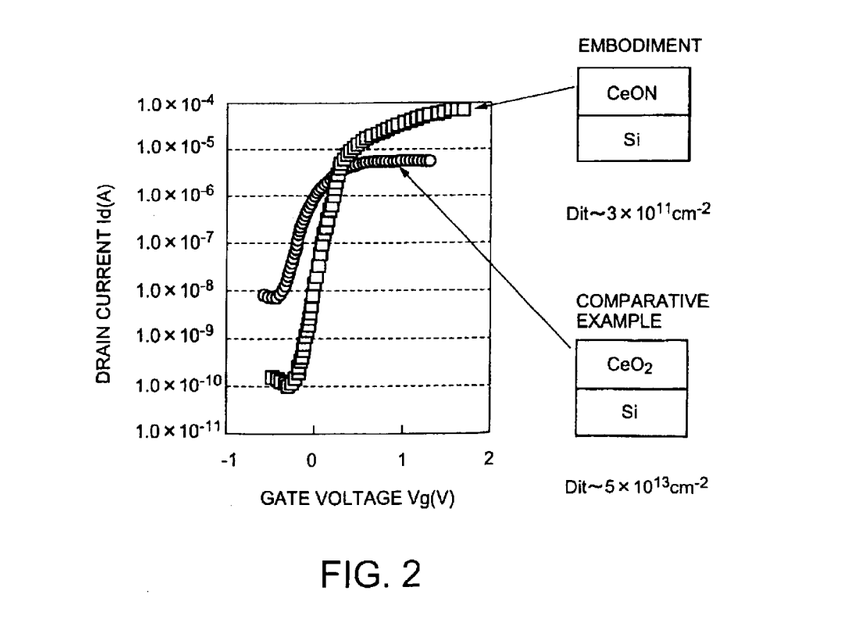
FIG. 2 shows relationships between drain current and gate voltage (Id-Vg characteristics) of an embodiment of the present invention and a comparative example.

FIG. 2 shows the relationship between the drain current Id and the gate voltage Vg (Id-Vg characteristics) of an n-channel MISFET having the gate dielectric formed by the above-described conventional method (comparative example). As shown in FIG. 2, in this MISFET, the ratio between ON and OFF states of the drain current is low, i.e., on the order of three digits. Further, the drain current in the ON state is quite low. S factor, which is gate voltage necessary to change the drain current by one decade in the subthreshold region, is one of important parameters for characterizing transistor performances. S-factor for an ideal transistor is near 60 mV/decade at room temperature, while that for an actual transistor increases due to the interface traps. The S factor for the MISFET with the $CeO_2$ gate dielectric is not so good, i.e., 160 mV/decade. The reason of such poor characteristics is revealed to be the degraded interface properties with a very high value of interface state density (Dit), Dit~$5 \times 10^{13}$ $cm^{-2}$. In addition, the leakage current is as high as 1 $Acm^{-2}$ at 1 V of gate voltage. The high leakage current is one reason why the OFF-state current is high.

Figure 3:
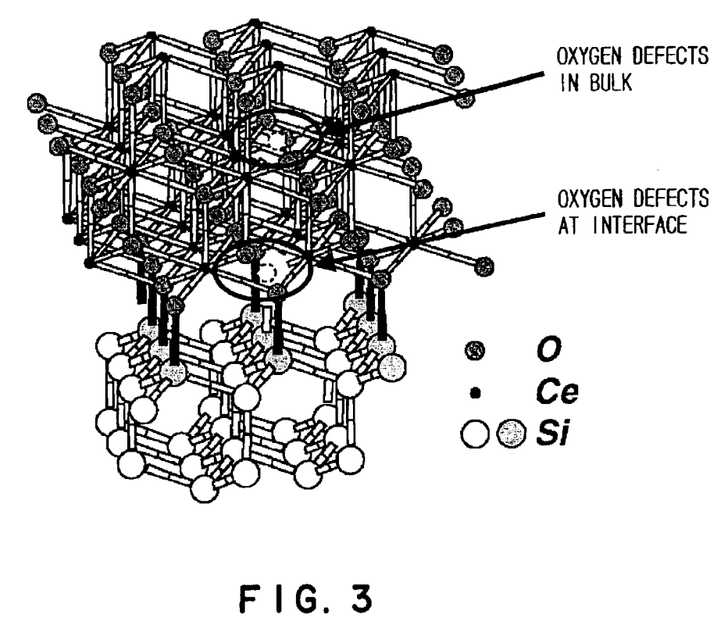
FIG. 3 shows the atomic arrangement at the interface between CeO$_2$ and Si (111).

FIG. 3 shows the atomic arrangement at the interface between $CeO_2$ and Si(111). At an ideal interface between $CeO_2$ and Si(111), all Si atoms are bonded to oxygen atoms. However, in actual cases, there are some oxygen defects, which cause Si dangling bonds. The experiment by the present inventors first revealed that this is the cause of the high interface state density. Further, as shown in FIG. 3, the defects of oxygen atoms also occur in $CeO_2$ bulk, inducing fixed charges, thereby causing the decrease in drain current. Moreover, the oxygen defects at the $CeO_2$/Si interface and in the bulk induce Poole-Frenkel conduction, which causes not only the increase in leakage current in the initial state but also hard breakdown or stress leakage current in the life testing. In order to improve the MISFET characteristics, elimination of oxygen defects at the interface and in the bulk is indispensable.

To perform annealing in the oxygen atmosphere or in the forming gas atmosphere so as to compensate for oxygen defects and/or to perform hydrogen termination of Si dangling bonds is a conventional technique. The comparative example is annealed in the forming gas (nitrogen gas with the hydrogen gas concentration of 5%) so as to verify whether the above-described method is effective for $CeO_2$ directly grown on Si.

Figure 4:
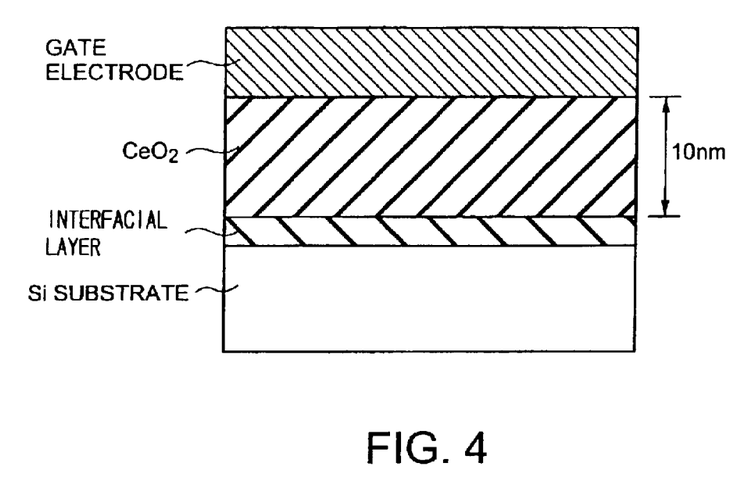
FIG. 4 is a schematic cross-sectional view after annealing.

FIG. 4 schematically shows a cross-sectional TEM (transmission electron microscope) image after the annealing. Before the annealing, $CeO_2$ is directly grown on Si without any interfacial layer. However, after the annealing, a thick amorphous layer (~2 nm) is formed at the interface. Although the forming gas does not contain oxygen as a main component, oxygen is mixed thereto due to a very little amount of moisture remaining in the annealing furnace. Since $CeO_2$ is very likely to allow oxygen to pass therethrough, the very little amount of oxygen easily reaches the interface between $CeO_2$ and Si and causes oxidation of Si, thereby forming the amorphous layer as shown in FIG. 4. Before the annealing, the EOT is very low, i.e., 0.4 nm. However, after the annealing, the EOT greatly increases to 1.5 nm. Thus, the annealing in the oxygen atmosphere or in the forming gas atmosphere is not suitable for highly-miniaturized LSIs, in which the EOT values must be less than 1 nm. Thus, it is revealed that the conventional annealing method cannot compensate for the oxygen defects in $CeO_2$, and that it is necessary to find a new solution.

As the result of further study, the present inventors have found that it is possible to decrease the interface states and/or the fixed charges by adding nitrogen to $CeO_2$. In this way, the oxygen defects at the interface or in the bulk are substituted by nitrogen, thereby considerably improving the MISFET characteristics.

(First Embodiment)

An n-channel MISFET according to the first embodiment of the present invention includes a single-crystalline layer of rare earth metal oxide containing nitrogen (e.g., CeON), which serves as the gate dielectric 3. The structure of the MISFET of this embodiment is as per FIG. 1, and the Si substrate 1 has the (111) surface orientation.

Figure 8:
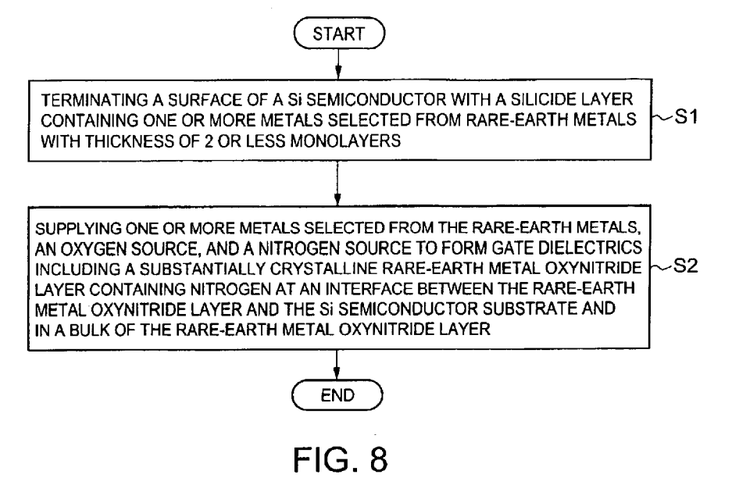
FIG. 8 is a flow chart showing the process of fabricating gate dielectrics of the MISFET according to an embodiment of the present invention.

The gate dielectric of the MISFET according to this embodiment is formed in the following manner (FIG. 8). After the device isolation regions 2 are formed, the surface of the Si substrate is hydrogen-terminated by diluted hydrofluoric acid. Then, the substrate 1 is inserted into an MBE machine. The temperature of the substrate is set to be 600° C., and the 0.6 monolayer Ce atomic layer using metal Ce as the deposition source is deposited on the Si prior to gas supply, resulting in a formation of a Ce-silicide layer (FIG. 8, step S1). Thereafter, both ozone ($O_3$) gas and nitrogen gas are supplied with Ce to form the Ce oxynitride layer (FIG. 8, step S2). Although ozone is used as the oxygen source in this case, it is possible to use oxygen gas or oxygen radicals as the oxygen source. Further, nitrogen radicals can be used as the nitrogen source. The partial pressures are $1 \times 10^{-8}$ Torr for both ozone gas and nitrogen gas.

In this embodiment, a surface of a Si substrate is terminated with a silicide layer before a rare-earth metal oxynitride layer is deposited. When a rare-earth metal and gas sources are supplied simultaneously, an interfacial layer of $SiO_2$ is easily formed due to the low free energy of $SiO_2$ formation. The existence of the $SiO_2$ interfacial layer causes a large increase in EOT, because the dielectric constant of $SiO_2$ is as low as 3.9. The $SiO_2$ interfacial layer must be minimized to realize a gate dielectric with ultra-thin EOT. It is found that a Si surface termination with a silicide layer is key procedure for eliminating an interfacial layer. In the above case, the Ce atomic layer (the Ce-silicide layer) with thickness of 0.6 monolayers is deposited on the Si substrate. It can be use a silicide layer within 2 monolyaers. The thickness of the silicide layer must be 2 or less monolayers, otherwise gate leakage current drastically increases due to the conductive property of the silicide.

With such a fabricating procedure, it is possible to form a $CeO_{2-x}N_x$ layer in which oxide defects are substituted by nitrogen. The content of nitrogen (x) is 0.004 both at the interface and in the bulk. Furthermore, no amorphous layer such as a silicon oxide layer is formed at the interface between CeON and the Si substrate 1. Thus, single-crystalline $CeO_{2-x}N_x$ directly grown on Si is realized (FIG. 8, step S2). The EOT value of CeON with the physical thickness of 5 nm is 0.4 nm. Such a low EOT value can be realized by the deposition of the silicide layer before CeON growth. The value of EOT for CeON is the same as the case where no nitrogen is contained. The reason for this is thought that since the content of nitrogen is low, the dielectric constant may be unchanged.

FIG. 2 shows the Id-Vg characteristics of the MISFET including the gate dielectric of $CeO_{2-x}N_x$, fabricated in accordance with this embodiment. As can be understood from the comparison with the Id-Vg characteristics of the comparative example shown in FIG. 2, the ratio between the ON and OFF states of the drain current is improved, i.e., on the order of six digits. Further, the drain current in the ON state is increased to be more than ten times compared with that of the comparative example.

S factor is one of important parameters for characterizing transistor performances. The S factor for the MISFET with the CeON gate dielectric is calculated to be 75 mV/decade from the Id-Vg characteristics in FIG. 2. It is significantly improved compared with that with the $CeO_2$ gate dielectric, since the interface state density (Dit) of this MISFET is considerably reduced i.e., ~$3\times10^{11}$ cm$^{-2}$. It is understood that the good device characteristics as shown in FIG. 2 are obtained because the carrier mobility in the inversion layer is improved due to the reduction in the interface state density.

Further, since the oxygen defects in the bulk are substituted by nitrogen, the fixed charges are reduced, resulting in the increase in drain current. Moreover, the leakage current at the gate voltage of 1 V is reduced to be $2\times10^{-3}$ Acm$^{-2}$, there by decreasing the OFF current.

As the result of a life test, it is revealed that the CeON gate dielectric has high reliabilities with a high dielectric constant, maintaining good interface properties. As described before, the oxygen defects at the interface between $CeO_2$ and Si or in the gate dielectric cause the Poole-Frenkel conduction, thereby causing the increase in initial leakage current, and the occurrence of hard breakdown and/or stress leakage current in life testing. It is possible to suppress the Poole-Frenkel conduction by adding nitrogen as in this embodiment, thereby realizing sufficient reliabilities as LSI gate dielectrics. Thus, the use of Ce oxynitride containing Ce as a rare-earth metal element considerably improves the transistor characteristics. The transistor characteristics are also greatly improved with an oxynitride dielectric layer with other rare-earth metal element such as Y, Dy and La.

In the present invention, the term "crystalline materials" may include polycrystalline materials, epitaxial materials, and single-crystalline materials. Polycrystalline materials include crystal grains of a certain grain size, in which each grain has random orientation. Epitaxial materials include crystal grains of a certain grain size, in which gains are oriented in a certain direction. Grains in epitaxial materials can be rotated within a certain plane. Single-crystalline materials may be included in the category of epitaxial materials, but there is no grain therein, and the orientation is uniform throughout the materials.

As described before, the addition of nitrogen to amorphous materials such as SiON, ZrON, HfON, etc., cause the degradation of interface properties. However, in this embodiment, the addition of nitrogen considerably improves the interface properties. That is, the effect of adding nitrogen in this embodiment is completely different from that of conventional cases. Such a difference is caused by the difference between amorphous materials and crystalline materials. In crystalline materials, since the sites of oxygen atoms are clearly determined, the lack of oxygen atoms results in clear defects. Accordingly, it is necessary to compensate for such defects. Furthermore, since the sites of the oxygen defects are clear, it is easy for nitrogen atoms to occupy such sites. Therefore, the effects of the addition of nitrogen are more noticeable in a crystalline rare-earth metal oxynitride layers, particularly in epitaxial layers. Further, the addition of nitrogen is considerably effective in a single-crystalline rare-earth metal oxynitride layers. Since crystalline rare-earth metal oxides, especially epitaxial and/or single-crystalline rare-earth metal oxide layers have a problem in that there are many oxygen defects at the interface between the rare-earth metal oxide layers and Si substrates, the addition of nitrogen to the interface has remarkable effects.

(Second Embodiment)

The effects of adding nitrogen are confirmed for all rare-earth metal oxides. It means that it is possible to use a rare-earth metal oxynitride layer containing any or any combination of 17 rare-earth metals, i.e., La, Ce, Pr, Nd, Pm, Sm, Eu, Gd, Tb, Dy, Ho, Er, Tm, Yb, Lu, Y, and Sc. A further study has revealed that the use of a rare-earth metal oxynitride layer containing Y, Ce, Dy, or La has remarkable effects on the improvement of the interface properties. Since it is found that oxygen defects are likely to occur especially in the crystalline rare-earth metal oxide layers such as $Y_2O_3$, $CeO_2$, $Dy_2O_3$ and $La_2O_3$, the effect of adding nitrogen is remarkable. On the other hand, in the case of amorphous materials such as SiON, ZrON, HfON, etc., even if there are oxygen defects in those materials, they are not recognized as clear defects. Accordingly, the effect of adding nitrogen does not have a great effect. On the contrary, the addition of nitrogen in the amorphous layers could change the bonding state of Si in Si substrates with oxygen, Si, Zr, Hf, etc. in the amorphous materials, thereby increasing the interface states.

An n-channel MISFET according to the second embodiment of the present invention includes a single-crystalline layer of rare-earth metal oxide containing nitrogen (e.g., $Dy_2O_{3-x}N_x$), which serves as the gate dielectric 3. The structure of the MISFET of this embodiment is as per FIG. 1, and the Si substrate 1 has the (111) surface orientation.

The gate dielectric of the MISFET according to this embodiment is formed in the following manner (FIG. 8). After the device isolation regions 2 are formed, the surface of the Si substrate is hydrogen-terminated by diluted hydrofluoric acid. Then, the substrate 1 is inserted into an MBE machine. The temperature of the substrate is set to be 700° C., and the 1.2 monolayer Dyatomic layer using metal Dy as the deposition source is deposited on the Si prior to gas supply, forming a Dy silicide layer (FIG. 8, step S1). It is effective to eliminate a $SiO_2$ interfacial layer. The thickness of the Dy silicide layer must be 2 or less monolayers, otherwise gate leakage current drastically increases due to the conductive property of the silicide. Thereafter, ozone ($O_3$) gas with a partial pressure of $1\times10^{-7}$ Torr, and nitrogen gas with a partial pressure of $2.5\times10^{-7}$ Torr are supplied with Dy (FIG. 8, step S2). After the 2 monolayer of a DyON layer deposition, the partial pressures of the nitrogen gas are decreased to $1\times10^{-7}$ Torr. It is found that the decrease of the nitrogen partial pressure after the growth of 0.6–3 monolayer of DyON layer is very effective to increase the nitrogen content at the interface between DyON and Si substrate, compared with that in the DyON bulk, resulting in the low interface state density.

With such a fabricating procedure, it is possible to form a $Dy_2O_{3-x}N_x$ layer in which oxide defects are substituted by nitrogen. The content of nitrogen (x) is 0.01 at the interface and 0.003 in the bulk. Furthermore, no amorphous layer such as a silicon oxide layer is formed at the interface between $Dy_2O_{3-x}N_x$ and the Si substrate 1. Thus, single-crystalline $Dy_2O_{3-x}N_x$ directly grown on Si is realized (FIG. 8, step S2). The EOT value of $Dy_2O_{3-x}N_x$ with the physical thickness of 5 nm is 1.7 nm, which is the same as the case where no nitrogen is contained ($Dy_2O_3$). The reason for this is thought that since the content of nitrogen is low, the dielectric constant may be unchanged.

The MISFET characteristics with the $Dy_2O_{3-x}N_x$ gate dielectric are considerably improved, as in the case of the CeON gate dielectric. The S factor of 71 mV/decade is obtained. Furthermore, the interface state density (Dit) is reduced to ~$2\times10^{11}$ cm$^{-2}$, and the increase in drain current caused by the decrease in fixed charges resulted from the replacement of oxygen defects with nitrogen in the bulk, are also confirmed. Further, the leakage current at the gate voltage of 1 V is as low as $1\times10^{-3}$ Acm$^{-2}$. From a life test, the gate dielectric is confirmed to have high reliabilities maintaining good interface properties with the high dielectric constant.

An $Y_2O_{3-x}N_x$ gate dielectric layer can be formed in the same manner as the $Dy_2O_{3-x}N_x$ layer, as described above. The EOT value for $Y_2O_{3-x}N_x$ (x=0.01 at the interface and x=0.004 in the bulk) with physical thickness of 5 nm is 1.4 nm. The S factor of 80 mV/decade is obtained for the MISFET with the $Y_2O_{3-x}N_x$ gate dielectric layer. Furthermore, the interface state density (Dit) is reduced to ~$5\times10^{11}$ cm$^{-2}$, and the increase in drain current caused by the decrease in fixed charges resulted from the replacement of oxygen defects with nitrogen in the bulk, are also confirmed. Further, the leakage current at the gate voltage of 1 V is as low as $2\times10^{-3}$ Acm$^{-2}$. From a life test, the gate dielectric is confirmed to have high reliabilities maintaining good interface properties with the high dielectric constant.

(Third Embodiment)

As explained above, the effects of adding nitrogen are remarkable for rare-earth metal oxynitride layers containing Y, Ce, Dy, or La. The rare-earth metal oxynitride layers can be in the forms of $Y_2O_{3-x}N_x$, CeON, $Dy_2O_{3-x}N_x$, $La_2O_{3-x}N_x$ and combinations of them. In the third embodiment, the use of $Dy_yLa_{2-y}O_{3-x}N_x$ will be explained.

An n-channel MISFET according to the third embodiment of the present invention includes a single-crystalline layer of rare-earth metal oxide containing nitrogen (e.g., $Dy_yLa_{2-y}O_{3-x}N_x$), which serves as the gate dielectrics 3. The structure of the MISFET of this embodiment is as per FIG. 1, and the Si substrate 1 has the (111) surface orientation.

The gate dielectric of the MISFET according to this embodiment is formed in the following manner (FIG. 8). After the device isolation regions 2 are formed, the surface of the Si substrate is hydrogen-terminated by diluted hydrofluoric acid. Then, the substrate 1 is inserted into an MBE machine. The temperature of the substrate is set to be 700° C., and the 0.6 monolayer Dy atomic layer using metal Dy as the deposition source is deposited on the Si prior to gas supply, forming a Dy silicide layer (FIG. 8, step S1). It is effective to eliminate a $SiO_2$ interfacial layer. The thickness of the Dy silicide layer must be 2 or less monolayers, otherwise gate leakage current drastically increases due to the conductive property of the silicide. Thereafter, Dy, La, ozone and nitrogen gas are supplied (FIG. 8, step S2). The partial pressures are $1\times10^{-7}$ Torr for both ozone gas and nitrogen gas. The $Dy_yLa_{2-y}O_{3-x}N_x$ layer is grown by using Dy, La, ozone and nitrogen gas.

With such a fabricating procedure, it is possible to form a $Dy_yLa_{2-y}O_{3-1\ Nx}$ layer in which oxide defects are substituted by nitrogen. The "y" value in $Dy_yLa_{2-y}O_{31\ x}N_x$ is set to be 1.46, with which $Dy_yLa_{2-y}O_{3-x}N_x$ can be lattice matched to Si. The content of nitrogen (x) is 0.004 both at the interface and in the bulk. Furthermore, no amorphous layer such as a silicon oxide layer is formed at the interface between $Dy_yLa_{2-y}O_{3-x}N_x$ and the Si substrate 1. Thus, single-crystalline $Dy_yLa_{2-y}O_{3-x}N_x$ directly grown on Si is realized. The EOT value of $Dy_yLa_{2-y}O_{3-x}N_x$ with the physical thickness of 5 nm is 1.4 nm, which is the same as the case where no nitrogen is contained ($Dy_yLa_{2-y}O_3$). The reason for this is thought that since the content of nitrogen is low, the dielectric constant may be unchanged.

The MISFET characteristics with the $Dy_yLa_{2-y}O_{3-x}N_x$ gate dielectric are considerably improved, as in the case of the CeON, $Dy_2O_{3-x}N_x$ and $Y_2O_{3-x}N_x$ gate dielectrics. The S factor of 78 mV/decade is obtained. Furthermore, the improvement in carrier mobility in the inversion layer caused by the reduction in interface state density (Dit), i.e., ~$3\times10^{11}$ cm$^{-2}$, and the increase in drain current caused by the decrease in fixed charge resulted from the replacement of oxygen defects with nitrogen in the bulk, are also confirmed. Further, the leakage current at the gate voltage of 1 V is as low as $1\times10^{-3}$ Acm$^{-2}$. From a life test, the gate dielectric is confirmed to have high reliabilities maintaining good interface properties with the high dielectric constant.

(Fourth Embodiment)

Figure 9:
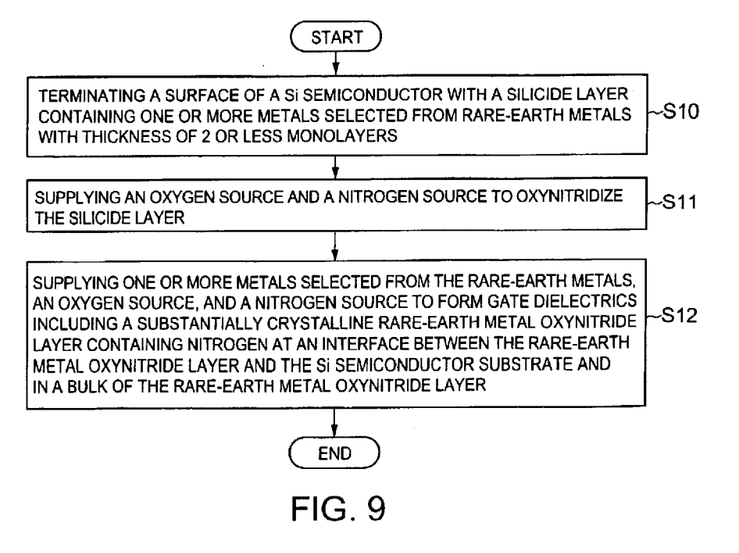
FIG. 9 is a flow chart showing the process of fabricating gate dielectrics of the MISFET according to an embodiment of the present invention.

Next, a MISFET according to the fourth embodiment of the present invention will be described. This MISFET includes the gate dielectrics 3 obtained by controlling the partial pressures of nitrogen and oxygen at the formation of a rare-earth oxynitride layer of $CeO_{2-x}N_x$ through the MBE technique, thereby increasing the nitrogen content at the interface as compared with that in the bulk. The MISFET according to this embodiment is fabricated in the following manner (FIG. 9).

First, as in the case of the first embodiment, grooves for device isolation are formed in the Si substrate 1, and then the device isolation regions 2 are formed. Subsequently, the Si (111) substrate, whose surface is hydrogen-terminated, is inserted into a molecular beam epitaxy (MBE) machine. The atomic Ce layer of 0.6 monolayer, using metal Ce as a deposition source, is deposited on the Si substrate at the substrate temperature of 600° C., prior to gas supply, forming a Ce silicide layer (FIG. 9, step S10). Then, ozone ($O_3$) gas with a partial pressure of $1\times10^{-8}$ Torr, and nitrogen gas with a partial pressure of $2.5-10^{-8}$ Torr are supplied to oxynitridize the Ce-silicide layer (FIG. 9, step S11). Subsequently, one monolayer of $CeO_{2-x}N_x$ is formed. Next, a $CeO_{2-x}N_x$ layer 3 having a physical thickness of 5 nm is formed by supplying ozone gas and nitrogen gas both having partial pressures of $1\times10^{-8}$ Torr (FIG. 9, step S12), where the nitrogen partial pressure is lowered compared with that at the time of oxynitridizing the Ce-silicide layer.

In this embodiment, a surface of a Si substrate is terminated with a silicide layer at first, and then the silicide layer is oxynitridize using oxygen and nitrogen sources before a rare-earth metal oxynitride layer is deposited. When a rare-earth metal and gas sources are supplied simultaneously on the Si substrate, an interfacial layer of $SiO_2$ is easily formed due to the low free energy of $SiO_2$ formation. It is found that a Si surface termination with a silicide layer is key procedure for eliminating an interfacial layer. It can be use a silicide layer within 2 monolyaers. The thickness of the silicide layer must be 2 or less monolayers, otherwise gate leakage current drastically increases due to the conductive property of the silicide. After that the silicide layer is oxynitridize in order to stabilize its surface. As the surface of the silicide layer is relatively unstable and reactive, the oxynitridization procedure may terminate reactive sites on the surface and may be able to improve the quality of the oxynitride layer, which will deposit on it.

Furthermore, it is preferable that the supply of the nitrogen source at the time of forming a rare-earth metal oxynitride layer is lower compared with that at the time of oxynitridizing the silicide layer. Because the nitrogen content at the interface between the oxynitride layer and the Si substrate can be increased compared with that in the bulk of the oxynitride layer, resulting in the further reduction of the interface state density.

In the $CeO_{2-x}N_x$ layer 3 formed through the above-described method, the surface density of nitrogen at the interface between CeON and Si is $5\times10^{13}$ $cm^{-2}$, and the volume density of nitrogen in the bulk is $1\times10^{20}$ $cm^{-3}$. That is, the nitrogen content (x) in the $CeO_{2-x}N_x$ layer 3 is ~0.01 at the interface and ~0.004 in the bulk.

The present inventors have revealed that, in $CeO_2$ directly grown on Si, there are more oxygen defects at the interface than those in the bulk. Accordingly, in the case of nitrogen addition, it is possible to achieve greater improvements in device performances by setting higher nitrogen content at the interface than that in the bulk. In this embodiment, the interface state density is $1\times10^{11}$ $cm^{-2}$, which is further lower than that of the first embodiment. In the single-crystalline $CeO_{2-x}N_x$ layer directly grown on Si without any amorphous interfacial layer such as a silicon oxide having the physical thickness of 5 nm, the EOT value is 0.4 nm, which is almost the same as the case where no nitrogen is added. The reason for this is considered that since the nitrogen content is relatively low, the dielectric constant may be almost unchanged. The MISFET characteristics are considerably improved. The S factor is 70 mV/decade, which is further improved as compared with the first embodiment. Moreover, the improvement in carrier mobility in the inversion layer caused by the reduction in interface state density (Dit), the increase in drain current caused by the decrease in fixed charge resulted from the replacement of oxygen defects with nitrogen in the bulk, are also confirmed. Further, the leakage current at the gate voltage of 1 V is as low as $1\times10^{-3}$ $Acm^{-2}$. From a life test, the gate dielectrics are confirmed to have high reliabilities maintaining good interface properties with the high dielectric constants. Since the amount of nitrogen added to the interface is higher than that in the bulk, it is possible to suppress the Poole-Frenkel conduction more effectively, thereby realizing sufficient reliabilities as LSI gate dielectrics.

An experiment by the present inventors has revealed that the MISFET characteristics are remarkably improved when the nitrogen surface density at the interface is set to be in the range of $(1~10)\times10^{13}$ $cm^{-2}$, and the nitrogen volume density in the bulk is set to be in the range of $1\times10^{17}$ $cm^{-3}$ to $1\times10^{20}$ $cm^{-3}$. This will be described below.

Figure 5:
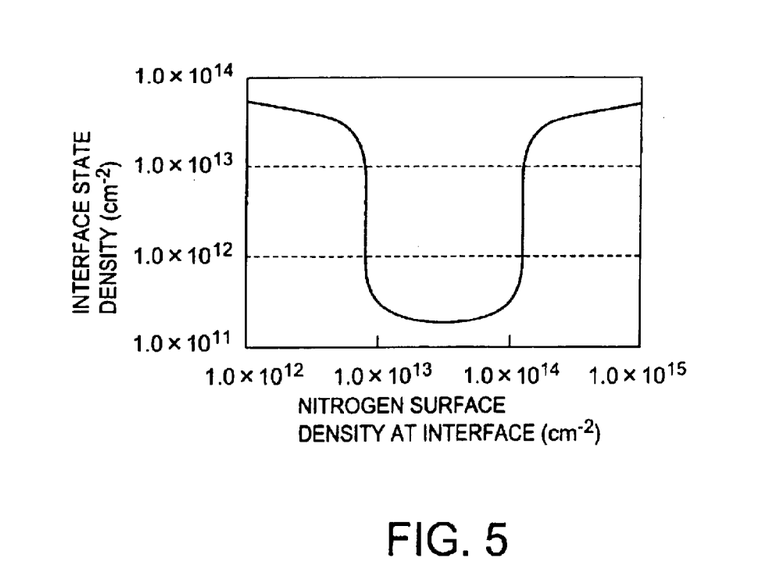
FIG. 5 shows the relationship between the surface density of nitrogen and the interface state density at the interface.

FIG. 5 shows the relationship between the nitrogen surface density and the interface state density. As can be understood from FIG. 5, when the nitrogen surface density at the interface is set to be in the range of $(1~10)\times10^{13}$ $cm^{-2}$, a dramatic reduction in interface state density to the order of $10^{11}$ $cm^{-2}$ can be achieved since oxygen defects are appropriately compensated. When the nitrogen concentration is less than $1\times10^{13}$ $cm^{-2}$, the interface state density becomes higher since oxygen defects at the interface are not sufficiently compensated. However, when the nitrogen surface density is over $1\times10^{14}$ $cm^{-2}$, the excessive nitrogen at the interface forms interface states, and the interface state density is increased. Because of the above-described reasons, the appropriate nitrogen surface density can be determined to be $(1~10)\times10^{13}$ $cm^{-2}$.

Figure 6:
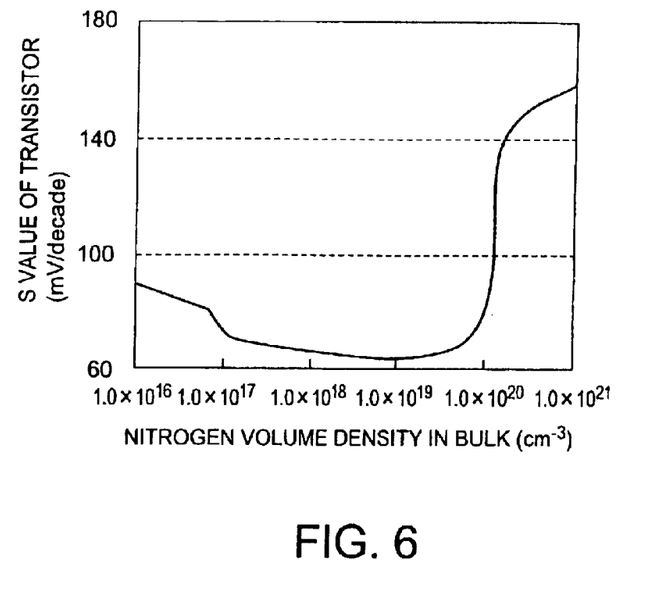
FIG. 6 shows the relationship between the volume density of nitrogen in the bulk and the S factor of transistors.

FIG. 6 shows the relationship between the nitrogen volume density in the bulk and the S factor of transistor. When the nitrogen volume density is below $1\times10^{17}$ $cm^{-3}$, the S factor is in the range of about 90~80 mV/decade, which is not satisfactory. The reason for this is that the oxygen defects, which are not compensated by nitrogen, induce fixed charges in the bulk, thereby lowering the carrier mobility. However, when nitrogen is added with the volume density of $1\times10^{17}$ $cm^{-3}$~$1\times10^{20}$ $cm^{-3}$, the fixed charges in the layer are reduced since the oxygen defects are fully compensated, thereby improving the S factor to be about 70 mV/decade. When the nitrogen volume density is over $1\times10^{20}$ $cm^{-3}$, $CeO_{2-x}N_x$ cannot stably exist in the mixed crystal state. Accordingly, the phase separation of $CeO_{2-x}N_x$ occurs to generate $CeO_2$ and $CeN_2$. For the reasons mentioned above, it is clear that the transistor characteristics are remarkably improved when the nitrogen volume density in the bulk is set to be in the range of $1\times10^{17}$ $cm^{-3}$~$1\times1^{20}$ $cm^{-3}$.

(Fifth Embodiment)

Next, a MISFET according to the fifth embodiment of the present invention will be described.

The MISFET according to this embodiment includes a Si substrate with the (001) surface orientation. A gate dielectric 3 of CeON is formed on the Si substrate 1. The layer of $CeO_2$ is epitaxially grown on the Si substrate 1, as will be discussed later. It is reported that $CeO_2$ is epitaxially grown on Si (111) with the (111) orientation having single crystalline phase (T. Inoue, Y. Yamamoto, S. Koyama, S. Suzuki and Y. Ueda, Appl. Phys. Lett. 29, L1199 (1990). The reason for this is considered that the surface energy on the (111) surface of $CeO_2$, whose structure is a fluorite structure, is quite low, so that it is difficult to have other surface orientations (S. Ikegawa and Y. Motoi, Thin Solid Films 281–282, 60 (1996)). $CeO_2$ layers formed on a Si (001) substrate become epitaxial layers with the (110) and/or (111) orientations.

First, the method of forming the gate dielectric 3 of the MISFET according to the fifth embodiment will be described (FIG. 8). Grooves for device isolation 2 are formed on the Si substrate 1. Then, the Si (001) substrate, whose surface has been hydrogen-terminated, is inserted into an MBE machine. Subsequently, the substrate temperature is set to be at 600° C., and a $CeO_{2-x}N_x$ layer with a physical layer thickness of 5 nm is formed by depositing the 0.6 monolayer Ce atomic layer on the Si substrate prior to gas supply, forming a Ce silicide layer (FIG. 8, step S1). It is effective to eliminate an interfacial layer. After that both ozone ($O_3$) gas and nitrogen gas are supplied with Ce (FIG. 8, step S2). The partial pressures of the supplied ozone gas and nitrogen gas are $1\times10^{-8}$ Torr. The obtained $CeO_{2-x}N_x$ layer 3 is an epitaxial layer oriented along two (110) directions, rotated at angle of 90° each other.

As in the case of a single crystal described above, oxygen defects in epitaxial layers are also substituted by nitrogen. The nitrogen content in this case is x=0.004 both at the interface and in the bulk. The epitaxial $CeO_{2-x}N_x$ layer is formed without any amorphous interfacial layer such as a silicon oxide layer, and has the EOT value of 0.6 nm. The dielectric constant in this CeON layer is smaller than that in the single crystal as described in the first embodiment. In the case of amorphous layers of CeON, the dielectric constants are further lowered. The dielectric constants in single-crystalline layers are largest among single crystalline layers, epitaxial layers, polycrystalline layers and amorphous layers. Those in epitaxial layers are next. Those in the polycrystalline layers are third. Those in amorphous layers are smallest. The reason for this is that in the cases of crystalline materials, i.e., single-crystalline materials, epitaxial materials, and polycrystalline materials, the dielectric constant is enhanced due to the stress from the Si substrate. The stress is largest in the single crystalline, and next in the epitaxial layers.

The $CeO_2N$ layer in this embodiment is an epitaxial layer having a certain orientation. It is possible to obtain the same effects in the case of a polycrystalline $CeO_2N$ layer. The reason for this is that polycrystalline materials are included in crystalline materials, in which clear oxygen defects occur, resulting in that the addition of nitrogen is effective.

In the MISFET using the $CeO_{2-x}N_x$ layer formed in the above-described manner as the gate dielectric, the interface state density is as low as $3 \times 10^{11}$ cm$^{-2}$, and the carrier mobility in the inversion layer is high. Thus, good MISFET characteristics are confirmed. The leakage current at the gate voltage of 1 V is as low as $5 \times 10^{-6}$ Acm$^{-2}$. From a life test, the gate dielectric is confirmed to have high reliabilities maintaining good interface characteristics with high dielectric constant.

(Sixth Embodiment)

Next, a MISFET according to the sixth embodiment of the present invention will be described. The MISFET according to this embodiment has a structure that a GdNdON gate dielectric layer 3 is formed on a Si substrate 1 with the (001) surface orientation.

First, the method of forming the gate dielectric 3 of the MISFET according to the sixth embodiment will be described (FIG. 8). Grooves for device isolation 2 are formed on the Si substrate 1. Then, the Si (001) substrate, whose surface is hydrogen-terminated, is inserted into an MBE machine. Thereafter, the substrate temperature is set to be at 600° C., and a $Gd_{2-y}Nd_yO_{3-x}N_x$ layer having a physical layer thickness of 5 nm is formed by depositing the 0.6 monolayer atomic $Gd_{2-y}Nd_y$ layer on the Si substrate using Gd and Nd metals as deposition sources prior to gas supply, forming a Gd-Nd silicide layer (FIG. 8, step S1), and then supplying both ozone ($O_3$) gas and nitrogen gas with Gd and Nd (FIG. 8, step S2). It is effective to eliminate an interfacial layer. The partial pressures of the supplied ozone gas and nitrogen gas are the same, i.e., $1 \times 10^{-8}$ Torr. The $Gd_{2-y}Nd_yO_{3-x}N_x$ layer thus obtained is in the polycrystalline phase (FIG. 8, step S2). The "y" value in $Gd_{2-y}Nd_yO_{3-x}N_x$ is set to be 0.5. The nitrogen content at the interface and in the bulk is the same, i.e., x=0.002. It is observed that in the $Gd_{2-y}Nd_yO_{3-x}N_x$ layer, oxygen defects are substituted by nitrogen. The EOT value of the $Gd_{2-y}Nd_yO_{3-x}N_x$ layer is 1.2 nm.

In the MISFET using the $Gd_{2-y}Nd_yO_{3-x}N_x$ gate dielectrics, the interface state density is as low as $7 \times 10^{11}$ cm$^{-2}$, and the carrier mobility in the inversion layer is high. Thus, good MISFET characteristics are obtained. The leakage current at the gate voltage of 1 V is as low as $5 \times 10^{-6}$ Acm$^{-2}$. From a life test, the gate dielectric is confirmed to have high reliabilities maintaining good interface characteristics with high dielectric constant.

(Seventh Embodiment)

Figure 7:
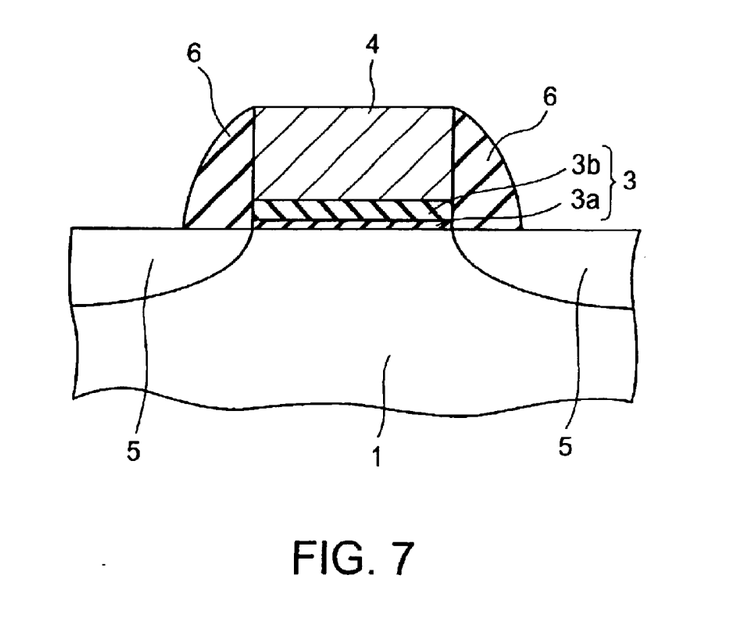
FIG. 7 is a cross-sectional view of the structure of a MISFET according to the seventh embodiment.

Next, a MISFET according to the seventh embodiment of the present invention will be described with reference to FIG. 7. As shown in FIG. 7, the MISFET of this embodiment includes the gate dielectrics 3 having multi-layered structure of a DyPrON gate dielectric layer (the lower side layer) 3a and a $La_2O_3$ gate dielectric layer 3b (the upper side layer) on a Si substrate 1 with the (111) surface orientation.

The gate dielectrics 3 of the MISFET according to this embodiment are formed in the following manner. First, grooves for device isolation 2 are formed on the Si substrate 1. Nest, The Si (111) substrate, whose surface is hydrogen-terminated, is inserted into an MBE machine. Subsequently, the substrate temperature is set to be at 500° C., and a $Dy_{2-y}Pr_yO_{3-x}N_x$ layer 3a having a physical thickness of 1 nm is formed by depositing the 0.6 monolayer Dy atomic layer on the Si substrate using metal Dy as a deposition source prior to gas supply, and then supplying Pr, ozone ($O_3$) gas and nitrogen gas. The partial pressure of both the ozone gas and the nitrogen gas is $1 \times 10^{-8}$ Torr. Thereafter, the $La_2O_3$ layer 3b with a physical thickness of 4 nm is formed by supplying La and ozone.

The $Dy_{2-y}Pr_yO_{3-x}N_x$ layer 3a thus obtained is single-crystalline with the (111) surface orientation, and the $La_2O_3$ layer 3b thus obtained is an epitaxial layer having the (110) orientation. By setting the value "y" in the $Dy_{2-y}Pr_yO_{3-x}N_x$ to be 1.04, the $Dy_{2-y}Pr_yO_{3-x}N_x$ layer is lattice matched to the Si substrate. The nitrogen concentration is the same both at the interface and in the bulk, i.e., x=0.004. It is observed that in the $Dy_{2-y}Pr_yO_{3-x}N_x$ layer 3a, oxygen defects are substituted by nitrogen. The $Dy_{2-y}Pr_yO_{3-x}N_x$ layer 3a is a single crystal without any amorphous interfacial layer such as a silicon oxide layer. The EOT value is 0.7 nm. In the MISFET of this embodiment including the thus obtained gate dielectrics 3 having the multi-layered structure of the $Dy_{2-y}Pr_yO_{3-x}N_x$ layer 3a and the $La_2O_3$ layer 3b, the interface state density is as low as $4 \times 10^{11}$ cm$^{-2}$, and the carrier mobility of the inversion layer is high. Thus, the good MISFET characteristics are obtained. The leakage current at the gate voltage of 1V is low, i.e., $1 \times 10^{-4}$ Acm$^{-2}$. Further, from a life test, the gate dielectrics are confirmed to have high reliabilities maintaining good interface characteristics with high dielectric constants.

As described above, it is possible to obtain the advantageous effects of the present invention even in this embodiment having the multi-layered structure of a rare-earth metal oxynitride layer and a rare-earth metal oxide layer. The upper layer of the multi-layered structure is not limited to a rare earth metal oxide layer with high dielectric constant but can be used any of dielectric layers formed of $SiO_2$ and/or high-k metal oxide layers such as $ZrO_2$, $HfO_2$, etc., or a rare-earth metal oxynitride layer.

Although explanations were made for oxynitride layers containing only one rare-earth metal, i.e., Y, Ce and Dy, and for rare-earth metal oxynitride layers containing two rare earth metals, i.e., Dy and La, Dy and Pr, and Gd and Nd, it is possible to use a rare-earth metal oxynitride layers containing any or any combination of 17 rare-earth metals, i.e., La, Ce, Pr, Nd, Pm, Sm, Eu, Gd, Th, Dy, Ho, Er, Tm, Yb, Lu, Y, and Sc.

Further, when non-volatile memories are formed based on the MISFETs of the above-described embodiments, i.e., when floating gates are formed in the above-described gate dielectrics, it is possible to improve the memory effects. Moreover, in such a non-volatile memory, it is possible to make the gate dielectrics between the Si substrate and the floating gate thinner since such gate dielectrics are stable. Thus, it is possible to decrease write voltage.

Thus, according to the present invention, it is possible to provide a field effect transistor including gate dielectrics with high dielectric constants, maintaining good Si interface properties.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A field effect transistor comprising:
   a gate dielectric including a substantially crystalline rare-earth metal oxynitride layer containing one or more metals selected from rare-earth metals, oxygen, and nitrogen, the rare-earth metal oxynitride layer contacting a predetermined region of a Si semiconductor substrate, and the nitrogen existing at an interface between the rare-earth metal oxynitride layer and the Si semiconductor substrate and in a bulk of the rare-earth metal oxynitride layer;

a gate electrode formed on the gate dielectric; and source and drain regions, one being formed at one side of the gate electrode and the other being formed at the other side of the gate electrode in the Si semiconductor substrate.

2. The field effect transistor according to claim 1, wherein the rare-earth metal oxynitride layer is epitaxially grown on said Si semiconductor substrate.

3. The field effect transistor according to claim 1, wherein the rare-earth metal oxynitride layer is single-crystalline.

4. The field effect transistor according to claim 1, wherein in the rare-earth metal oxynitride layer, a nitrogen content at the interface between the rare-earth metal oxynitride layer and the Si semiconductor substrate is higher than a nitrogen content in the bulk of the rare-earth metal oxynitride layer.

5. The field effect transistor according to claim 1, wherein the rare-earth metal of the rare-earth metal oxynitride layer is selected from the group consisting of Y, Ce, Dy, and La.

6. A method of fabricating a field effect transistor according to claim 1, comprising:

terminating a surface of the Si semiconductor substrate with a silicide layer containing one or more metals selected from rare-earth metals with thickness of 2 or less monolayers;

supplying one or more metals selected from the rare-earth metals, an oxygen source, and a nitrogen source to form the dielectric including the substantially crystalline rare-earth metal oxynitride layer containing nitrogen at the interface between the rare-earth metal oxynitride layer and the Si semiconductor substrate and in the bulk of the rare-earth metal oxynitride layer; and forming the gate electrode on the gate dieletric.

7. The method of fabricating a field effect transistor according to claim 6, wherein at the time of forming the rare-earth metal oxynitride layer, the supply of the nitrogen source is decreased immediately after a thickness of the rare-earth metal oxynitride layer reaches a range of 0.6 to 3 monolayers.

8. The method of fabricating a field effect transistor according to claim 6, further comprising oxynitridizing layer by supplying the oxygen source and the nitrogen source before forming the gate dielectric including the rare-earth metal oxynitride layer.

9. The method of fabricating a field effect transistor according to claim 8, wherein the supply of the nitrogen source at the time of forming the rare-earth metal oxynitride layer is lower than that at the time of oxynitridizing the silicide layer.

10. A field effect transistor comprising:

a gate dielectric including a substantially crystalline rare-earth metal oxynitride layer containing one or more metals selected from rare-earth metals, oxygen, and nitrogen, the rare-earth metal oxynitride layer contacting a predetermined region of a Si semiconductor substrate, and the nitrogen existing at an interface between the rare-earth metal oxynitride layer and the Si semiconductor substrate and in a bulk of the rare-earth metal oxynitride layer;

a gate electrode formed on the gate dielectric; and source and drain regions, one being formed at one side of the gate electrode and the other being formed at the other side of the gate electrode in the Si semiconductor substrate, wherein in the rare-earth metal oxynitride layer, a nitrogen surface density representing the nitrogen content at the interface between the rare-earth metal oxynitride layer and the Si semiconductor substrate is in the range of $(1\sim10)\times10^{13}$ cm$^{-2}$.

11. A field effect transistor comprising:

a gate dielectric including a substantially crystalline rare-earth metal oxynitride layer containing one or more metals selected from rare-earth metals, oxygen, and nitrogen, the rare-earth metal oxynitride layer contacting a predetermined region of a Si semiconductor substrate, and the nitrogen existing at an interface between the rare-earth metal oxynitride layer and the Si semiconductor substrate and in a bulk of the rare-earth metal oxynitride layer;

a gate electrode formed on the gate dielectric; and source and drain regions, one being formed at one side of the gate electrode and the other being formed at the other side of the gate electrode in the Si semiconductor substrate, wherein in the rare-earth metal oxynitride layer, a nitrogen volume density representing the nitrogen content in the bulk of the rare-earth metal oxynitride layer is in the range of $1\times10^{17}$ cm$^{-3}\sim1\times10^{20}$ cm$^{-3}$.

12. A field effect transistor comprising:

a gate dielectric including a substantially crystalline rare-earth metal oxynitride layer containing one or more metals selected from rare-earth metals, oxygen, and nitrogen, the rare-earth metal oxynitride layer contacting a predetermined region of a Si semiconductor substrate, and the nitrogen existing at an interface between the rare-earth metal oxynitride layer and the Si semiconductor substrate and in a bulk of the rare-earth metal oxynitride layer;

a gate electrode formed on the gate dielectric; and source and dram regions, one being formed at one side of the gate electrode and the other being formed at the other side of the gate electrode in the Si semiconductor substrate, wherein in the rare-earth metal oxynitride layer, a nitrogen surface density representing the nitrogen content at the interface between the rare-earth metal oxynitride layer and the Si semiconductor substrate is in the range of $(1\sim10)\times10^{13}$ cm$^{-2}$, and a nitrogen volume density representing the nitrogen content in the bulk of the rare-earth metal oxynitride layer is in the range of $1\times10^{17}$ cm$^{-3}\sim1\times10^{20}$ cm$^{-3}$.

13. A field effect transistor comprising:

a gate dielectric including a substantially crystalline rare-earth metal oxynitride layer containing one or more metals selected from rare-earth metals, oxygen, and nitrogen, the rare-earth metal oxynitride layer contacting a predetermined region of a Si semiconductor substrate, and the nitrogen existing at an interface between the rare-earth metal oxynitride layer and the Si semiconductor substrate and in a bulk of the rare-earth metal oxynitride layer;

a gate electrode formed on the gate dielectric; and source and drain regions, one being formed at one side of the gate electrode and the other being formed at the other side of the gate electrode in the Si semiconductor substrate, wherein the gate dielectric includes an oxide layer with a high dielectric constant formed on the rare-earth metal oxynitride layer.

14. The field effect transistor according to claim 13, wherein the rare-earth metal oxynitride layer is epitaxially grown on the Si semiconductor substrate.

15. The field effect transistor according to claim 13 wherein the rare-earth metal oxynitride layer is single-crystalline.

16. The field effect transistor according to claim 13, wherein in the rare-earth metal oxynitride layer, a nitrogen content at the interface between the rare-earth metal oxynitride layer and the Si semiconductor substrate is higher than a nitrogen content in the bulk of the rare-earth metal oxynitride layer.

17. The field effect transistor according to claim 13, wherein in the rare-earth metal oxynitride layer, a nitrogen surface density representing the nitrogen content at the interface between the rare-earth metal oxynitride layer and the Si semiconductor substrate is in the range of $(1\sim10)\times10^{-13}$ cm$^{-2}$.

18. The field effect transistor according to claim 13, wherein in the rare-earth metal oxynitride layer, a nitrogen volume density representing the nitrogen content in the bulk of the rare-earth metal oxynitride layer is in the range of $1\times10^{17}$ cm$^{-3}\sim1\times10^{20}$ cm$^{-3}$.

19. The field effect transistor according to claim 13 wherein the rare-earth metal of the rare-earth metal oxynitride layer is selected from the group consisting of Y, Ce, Dy, and La.

20. The field effect transistor according to claim 13, wherein the oxide layer is selected from the group consisting of a rare-earth metal oxide layer and a rare-earth metal oxynitride layer.

* * * * *